(12) United States Patent  
Kang et al.

(10) Patent No.: US 8,080,741 B2
(45) Date of Patent: Dec. 20, 2011

(54) PRINTED CIRCUIT BOARD

(75) Inventors: Myung Sam Kang, Daejeon (KR); Chin Kwan Kim, Daejeon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 901 days.

(21) Appl. No.: 12/149,522

(22) Filed: May 2, 2008

(65) Prior Publication Data

US 2008/0314633 A1  Dec. 25, 2008

(30) Foreign Application Priority Data

Jun. 20, 2007 (KR) .................. 10-2007-0060646

(51) Int. Cl.
*H05K 1/11* (2006.01)
(52) U.S. Cl. ....................... 174/262; 361/792
(58) Field of Classification Search .......... 174/262–266; 361/792–795
See application file for complete search history.

(56) References Cited

U.S. PATENT DOCUMENTS

| 6,534,723 | B1 * | 3/2003 | Asai et al. ............. 174/255 |
| 6,555,208 | B2 * | 4/2003 | Takada et al. .......... 428/209 |
| 7,188,413 | B2 * | 3/2007 | Jamil ....................... 29/852 |
| 2006/0191715 | A1 * | 8/2006 | Koyama et al. ........ 174/264 |

FOREIGN PATENT DOCUMENTS

| JP | 62-281356 | 12/1987 |
| JP | 11-045955 | 2/1999 |
| JP | 11-111766 | 4/1999 |
| JP | 2000-160895 | 9/2000 |
| JP | 2003-142811 | 5/2003 |
| JP | 2005-317901 | 11/2005 |
| JP | 2006-165196 | 6/2006 |
| JP | 2007-103878 | 4/2007 |

OTHER PUBLICATIONS

Japanese Office Action issued Jul. 6, 2010 in corresponding Japanese Patent Application 2008-110433.

* cited by examiner

*Primary Examiner* — Jeremy Norris

(57) ABSTRACT

A printed circuit board, which increases the contact area between an IC and a printed circuit board, thus increasing the degree of adhesion, is disclosed. The printed circuit board includes: an insulation layer which includes a first circuit pattern, including at least one via land, embedded in the upper surface of the insulation layer to be flush with the upper surface, and a second circuit pattern formed in the lower surface of the insulation layer to be flush with the lower surface; a solder resist layer formed on the insulation layer; a via hole and a bump integrally formed on the second circuit pattern through the via hole and the via land such that it protrudes from the insulation layer to be higher than the solder resist layer.

10 Claims, 5 Drawing Sheets

PRINTED CIRCUIT BOARD

CROSS REFERENCE TO RELATED APPLICATION(S)

This application claims the benefit of Korean Patent Application No. 10-2007-0060646, filed Jun. 20, 2007, entitled "PRINTED CIRCUIT BOARD", which is hereby incorporated by reference in its entirety into this application.

BACKGROUND OF THE INVENTION

1. Field of the Invention

The present invention relates to a printed circuit board, and more particularly to a printed circuit board, which is adapted to increase the contact area between an IC and a printed circuit board, thus increasing the degree of adhesion therebetween.

2. Description of the Prior Art

These days, as the degree of integration of semiconductor devices is gradually increasing, the trend is for the number of connecting pads mounted on the semiconductor device, which are provided to connect the semiconductor device to exterior circuits, to increase, and also for the mounting density to increase.

In semiconductor equipment such as semiconductor packages, on which the above-mentioned semiconductor devices are mounted, in particular, portable information equipment such as notebook-sized personal computers, PDAs and cellular phones, demands for miniaturization and slimness and high connection reliability between the semiconductor devices and parent substrates are required so as to increase mounting density.

FIG. 1 is a cross-sectional view showing a structure of a substrate, which is useful for flip bonding of a conventional printed circuit board.

Referring to FIG. 1, in the manufacturing process of the conventional printed circuit board, a circuit pattern including a via land 102 is first formed on an insulation layer 100, and then a solder resist layer 104 is applied on the circuit pattern to cover the circuit pattern.

At this point, the outermost circuit pattern including the via land 102 is formed through electroless plating and electroplating processes.

The solder resist layer 104 is formed such that it allows a portion of the via land 102 to be exposed therethrough while covering the remaining area of the via land 102.

In other words, the solder resist layer 104 is formed on the insulation layer 100 in such a way that the solder resist layer covers the entire area of the circuit pattern, with the exception of the portion of the via land 102.

Then, a solder bump 106, which is to be connected to an IC (Integrated Circuit), is formed on the via land 102.

At this point, the solder p 106 is formed in such a way that conductive material such as conductive paste is printed on the via land 102 and is heat-treated, thus being deformed into a spherical shape, and the spherical mass is flattened through a coining process in order to compensate for mounting variation at the time of the IC mounting procedure.

The printed circuit board, which is manufactured through the above-described conventional technology, is a SOP (Solder On Pad) type.

However, since the conventional printed circuit board is manufactured in a manner such that the outermost circuit pattern including the via land 102 is formed through a plating process, the upper surface of the circuit pattern becomes uneven due to the plating tolerance. Consequently, in the case of formation of the solder bump 106, it is problematic in that there may be solder bumps 106 that are not connected to the IC at locations where printing material is insufficient.

Further, because the conventional printed circuit board is manufactured into an SOP type, the contact area between the IC bumps and the solder bumps of the printed circuit board is decreased, thus decreasing the reliability.

SUMMARY OF THE INVENTION

Accordingly, the present invention has been made keeping in mind the above problems occurring in the prior art, and the present invention is intended to provide a printed circuit board, which is adapted to increase the contact area between an IC and a printed circuit board, thus increasing the degree of adhesion therebetween.

In an aspect, the present invention provides a printed circuit board, including: an insulation layer which includes a first circuit pattern, including at least one via land, embedded in an upper surface of the insulation layer such that it is flush with the upper surface, and a second circuit pattern formed in a lower surface of the insulation layer such that it is formed at a position corresponding to the at least one via land and is flush with the lower surface; a solder resist layer formed on the insulation layer; a via hole formed in the insulation layer to electrically connect the via land to the second circuit pattern; and a bump integrally formed on the second circuit pattern through the via hole and the via land such that it protrudes from the insulation layer to be higher than the solder resist layer.

The first circuit pattern may have an uneven lower surface and the second circuit pattern may have an uneven upper surface.

The bump may include a head part, and a lower end of the head part, which is brought into contact with the via land, is larger than a diameter of the via hole but smaller than a diameter of the via land.

The bump may include a planar upper surface.

The bump may include a concave upper surface having a recess in a center thereof.

The bump may include an overhang-type head part.

The solder resist layer may be formed on the insulation layer such that it covers the first circuit pattern and a portion of the via land.

The solder resist layer may be formed on the insulation layer such that it covers the first circuit pattern but does not cover the via land.

The printed circuit board may further include a plating layer formed on the bump.

The printed circuit board may further include a solder layer formed on the bump.

In another aspect, the present invention provides a printed circuit board, including: an insulation layer; a first circuit pattern embedded in an upper surface of the insulation layer such that it is flush with the upper surface; a second circuit pattern embedded in a lower surface of the insulation layer such that it is flush with the lower surface; a via hole formed in the insulation layer deviating from the first circuit pattern and allowing an upper surface of the second circuit pattern to be exposed therethrough; a solder resist layer formed on the insulating layer other than the via hole; and a bump integrally formed on the second circuit pattern through the via hole such that it protrudes from the insulation layer to be higher than the solder resist layer.

The first circuit pattern may have an uneven lower surface and the second circuit pattern may have an uneven upper surface.

The bump may include a head part, and a lower end of the head part, which is brought into contact with the via land, is larger than a diameter of the via hole.

The bump may include a planar upper surface.

The bump may include a concave upper surface having a recess in a center thereof. The bump may include an overhang-type head part.

The printed circuit board may further include a plating layer formed on the bump.

The printed circuit board may further include a solder layer formed on the bump.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

This invention will be described in further detail by way of example with reference to the accompanying drawings.

Figure 1:
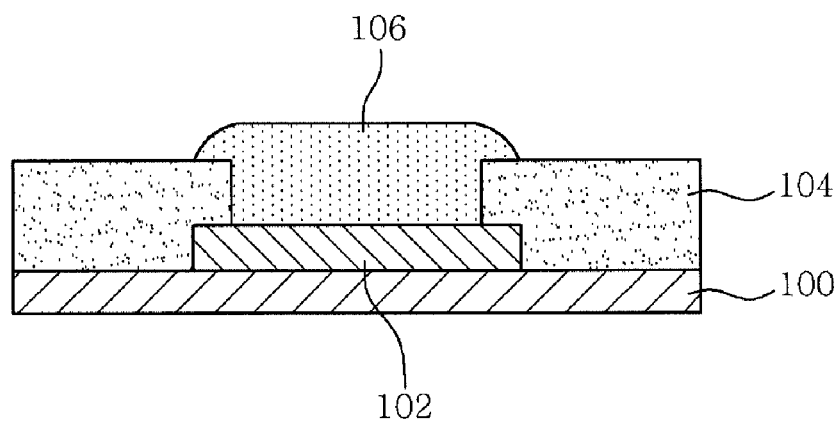
FIG. 1 is a cross-sectional view showing the structure of a substrate, which is useful for flip bonding of a conventional printed circuit board.
Figure 2:
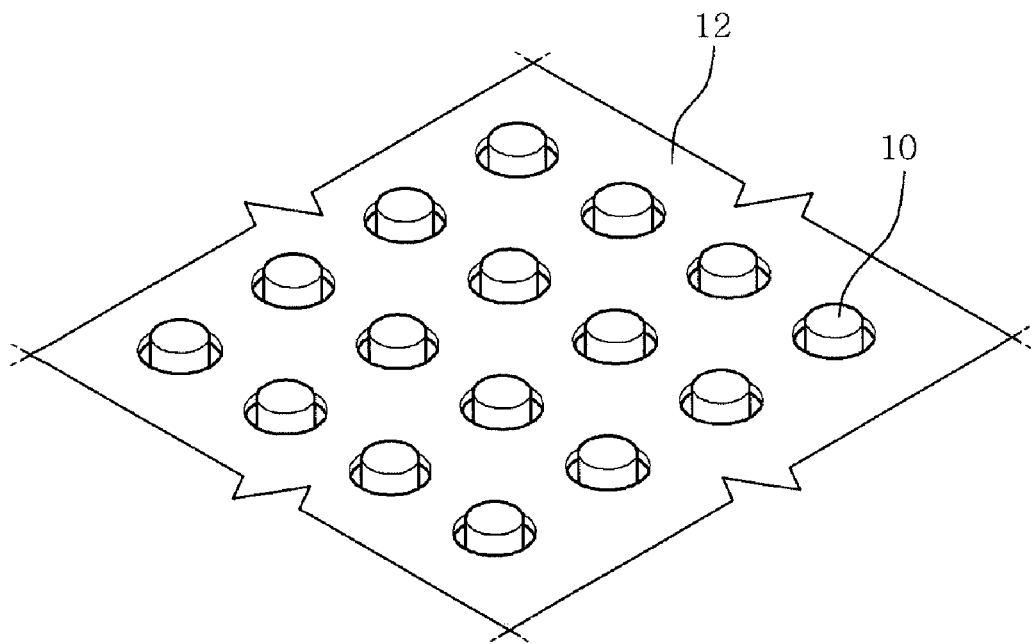
FIG. 2 is a schematic perspective view showing a printed circuit board according to a first embodiment of the present invention.
Figure 3A:
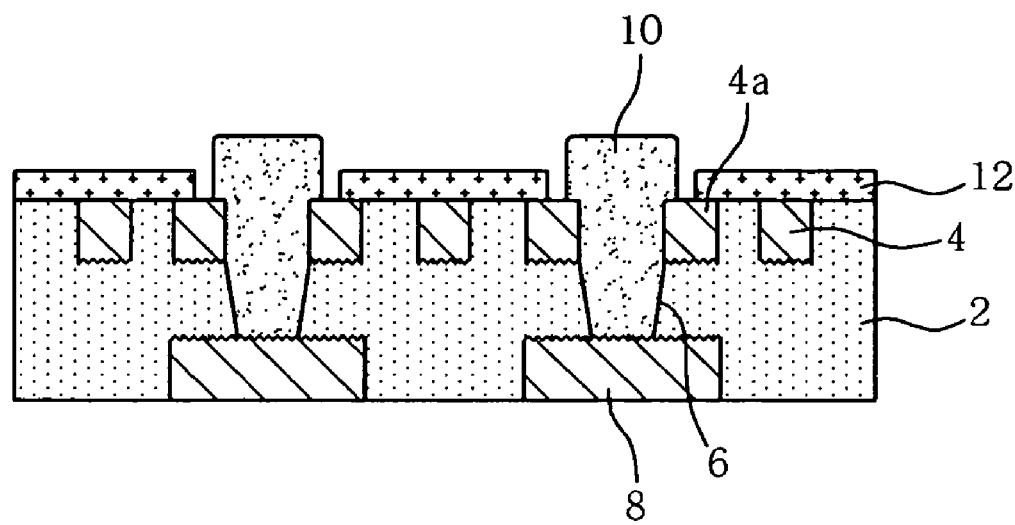
FIGS. 3A and 3B are cross-sectional views showing a first embodiment of the printed circuit board shown in FIG. 2.
Figure 3B:
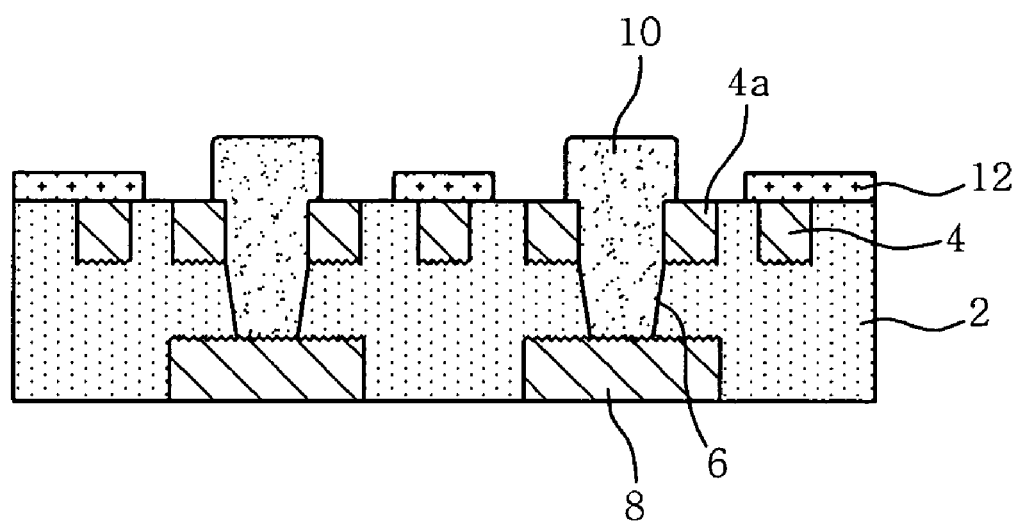
Figure 4A:
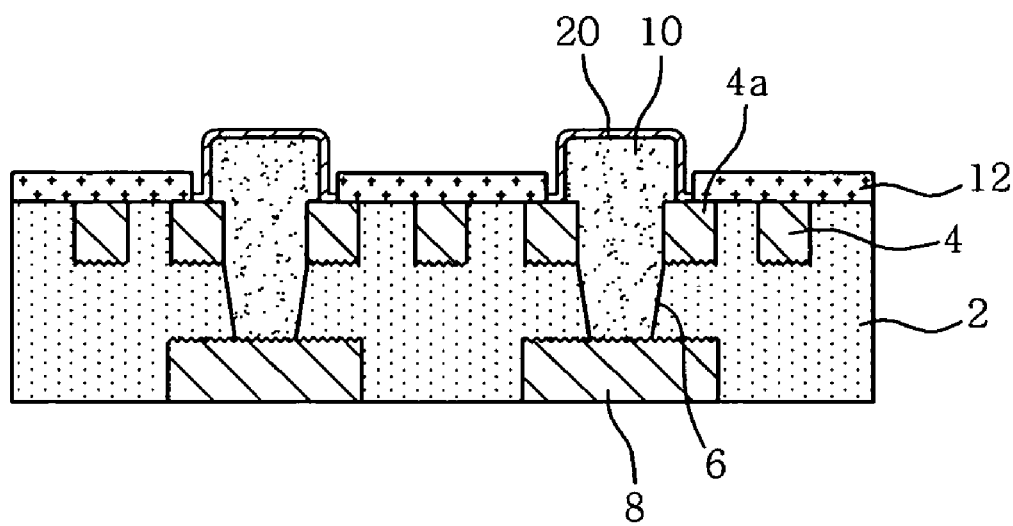
FIGS. 4A and 4B are cross-sectional views showing a second embodiment of the printed circuit board shown in FIG. 2.
Figure 4B:
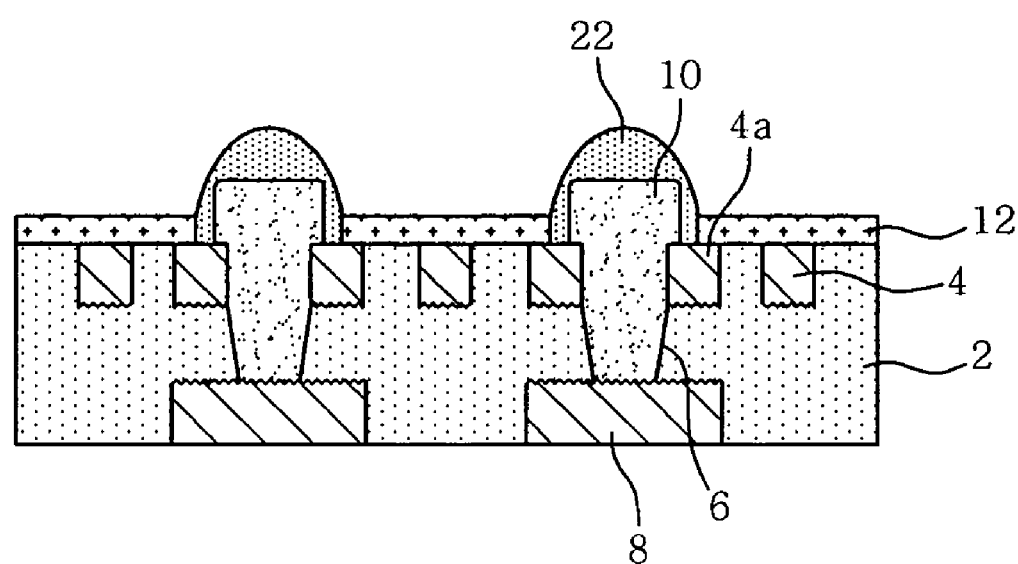
Figure 5:
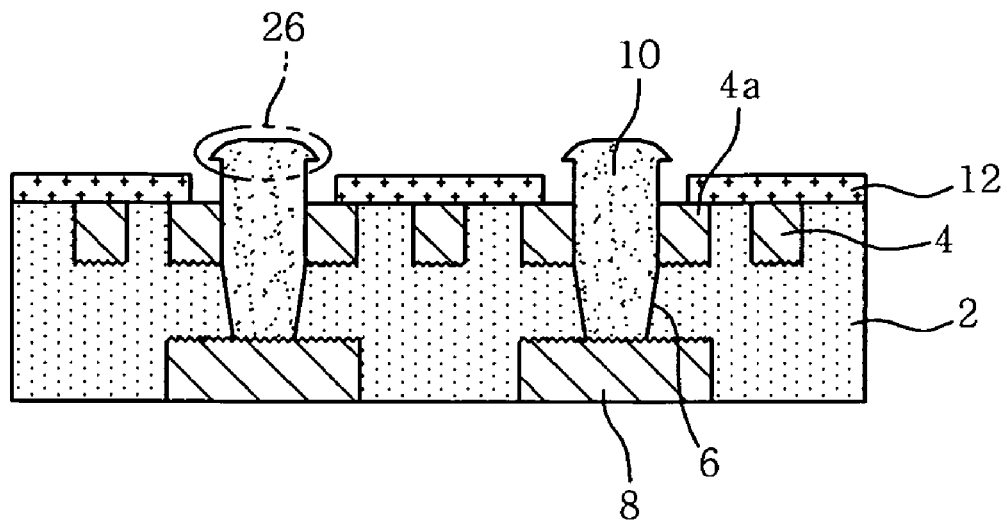
FIG. 5 is a cross-sectional view showing a third embodiment of the printed circuit board shown in FIG. 2.
Figure 6:
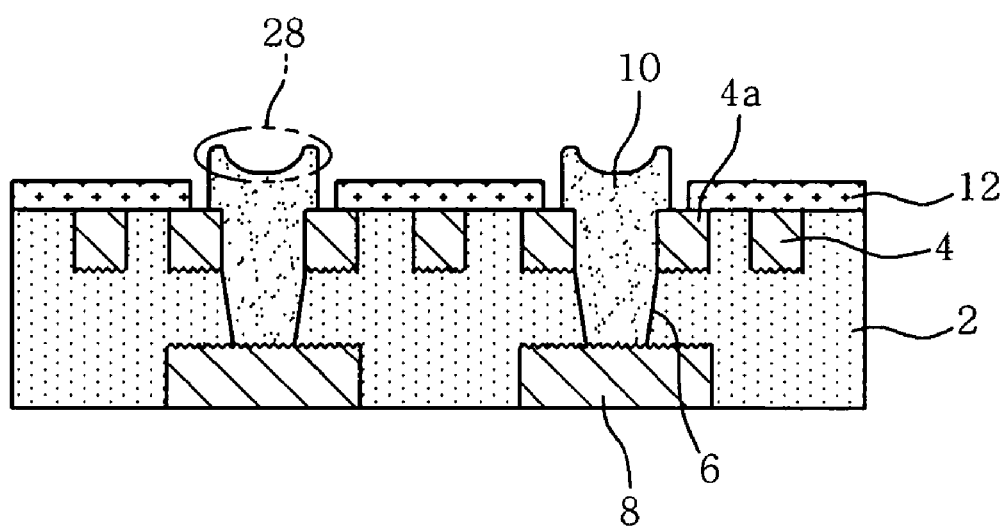
FIG. 6 is a cross-sectional view showing a fourth embodiment of the printed circuit board shown in FIG. 2.

FIG. 2 is a schematic perspective view showing a printed circuit board according to a first embodiment of the present invention, FIGS. 3A and 3B are cross-sectional views showing a first embodiment of the printed circuit board shown in FIG. 2, FIGS. 4A and 4B are cross-sectional views showing a second embodiment of the printed circuit board shown in FIG. 2, FIG. 5 is a cross-sectional view showing a third embodiment of the printed circuit board shown in FIG. 2, and FIG. 6 is a cross-sectional view showing a fourth embodiment of the printed circuit board shown in FIG. 2.

Referring to FIGS. 2 to 6, the printed circuit board according to the first embodiment of the present invention comprises: an insulation layer 2 which includes a first circuit pattern 4, including at least one via land 4a, embedded in the upper surface of the insulation layer 2 such that it is flush with the upper surface, and a second circuit pattern 8 formed in the lower surface of the insulation layer 2 such that it is formed at a position corresponding to the via land 4a and is flush with the lower surface; a solder resist layer 12 formed on the insulation layer 2; a via hole 6 formed in the insulation layer 2 to electrically connect the via land 4a to the second circuit pattern 8; and a bump 10 integrally formed on the second circuit pattern 8 through the via hole 6 and the via land 4a such that it protrudes from the insulation layer 2 to thus be higher than the solder resist layer 12.

Although the insulation layer 2 is essentially made of resin material which is excellent in electrical properties, it may be mixed with reinforcing material such as glass fiber and glass nonwoven fabric so as to overcome disadvantages in which the resin material has poor mechanical strength and undergoes a large change in dimensions upon temperature variation (high coefficient of thermal expansion), as much as ten times that of metal.

The insulation layer 2 is provided on one surface thereof with the first circuit pattern 4 including the via land 4a and on the other surface thereof with the second circuit pattern 8, which are embedded in the insulation layer 2.

More specifically, the first circuit pattern 4 including the via land 4a is formed on the upper surface of the insulation layer 2 such that the upper surface thereof is flush with the upper surface of the insulation layer 2 while being exposed.

The lower surface of the first circuit pattern 4, which is embedded in the insulation layer 2 and is thus not exposed, is formed to be uneven.

Further, the second circuit pattern 8 is embedded in the lower surface of the insulation layer 2 such that it is formed at a position corresponding to the via land 4a and the lower surface thereof is flush with the lower surface of the insulation layer 2 while being exposed.

The upper surface of the second circuit pattern 8, which is embedded in the insulation layer 2 and thus not exposed, is formed to be uneven.

The solder resist layer 12 is formed on both surfaces of the insulation layer 2 such that it covers a portion of the first circuit pattern 4 and a portion of the second circuit pattern 8 and the remaining portions of the first and second circuit patterns are exposed, so as to protect the first and second circuit patterns 4 and 8.

The solder resist layer 12 may be formed into an SMD (Solder Mask Defined) type in which the solder resist layer 12 is formed on the insulation layer 2 to cover a portion of the via land 4a between the via land 4a and the bump 10, as shown in FIG. 3A. Alternatively, the solder layer 12 may be formed into an NSMD (Non Solder Mask Defined) type, in which the solder resist layer 12 formed on the insulation layer 2 to cover the first circuit pattern 4, but not the via land 4a.

The via hole 6 is formed in the insulation layer 2 so as to electrically connect the via land 4a to the second circuit pattern 8.

Although the via hole 6 is formed in the form of a blind via hole, in which the via hole 6 is formed through the via land 4a and the insulation layer 2 and the upper surface of the second circuit pattern 8 is exposed therethrough, the via hole 6 may be formed in the form of a through-hole in which the via hole 6 is formed through all of the via land 4a, the insulation layer 2 and the second circuit pattern 8.

The bump 10 is integrally formed inside the via hole 6 and on the via land 4a such that it protrudes from the insulation layer 2 to thus be higher than the solder resist layer 12.

In this regard, the bump 10 is sized such that the head part of the bump 10, protruding from the insulation layer 2, has, at its lower end contacting the via land 4a, a diameter larger than the diameter of the via hole 6, but smaller than the diameter of the via land 4a.

Alternatively, the bump 10 may be formed to be lower than the solder resist layer 12.

The bump 10 may be formed by filling the via hole 6 with conductive paste, and may be subjected to an OSP (Organic Solderability Preservative) process so as to prevent oxidation of the portion exposed from the via land 4a.

Where the bump 10 is not subjected to the OSP process, the bump 10 may be covered with a plating layer 20 comprised of metals such as nickel and gold, as shown in FIG. 4A, or may be covered with a solder layer 22, as shown in FIG. 4B.

In this regard, the solder layer 22 may be comprised of conductive material such as conductive paste.

The top surface of the bump 10 may be formed in a planar shape, as shown in FIGS. 3A and 3B, or may be formed in an overhanging shape 26, like a mushroom, as shown in FIG. 5.

In the case where the bump 10 is formed in the overhanging shape, the lower end of the head part of the bump 10 does not come into contact with the upper surface of the insulation layer 2, and the overhang-shaped head part is sized to be larger than the diameter of the via hole 6 but smaller than the diameter of the second circuit pattern 8, including the via hole 6 formed thereon.

In another alternative, the top surface of the bump 10 may be formed to be concave, thus having a recess 28, as shown in FIG. 6. In this case, the diameter and depth of the recess 28 may be controlled through an etching process using an etching liquid.

As a result of this, in the mounting of ICs, the contact area between the bump 10 and an IC bump is increased, thus increasing the strength of adhesion therebetween.

As described above, the printed circuit board according to an embodiment of the present invention has advantages in that it facilitates electric testing since the bump 10, on which an IC is mounted, protrudes high, and it is possible to increase the reliability of the resulting printed circuit board since the contact area between the bump 10 and an IC bump and thus the cohesion intensity therebetween are increased.

In addition, since the printed circuit board according to an embodiment of the present invention has a small height difference between the solder resist layer 12 and the insulation layer 2, it is advantageous in that the underfill void is decreased at the time of mounting of ICs.

Figure 7:
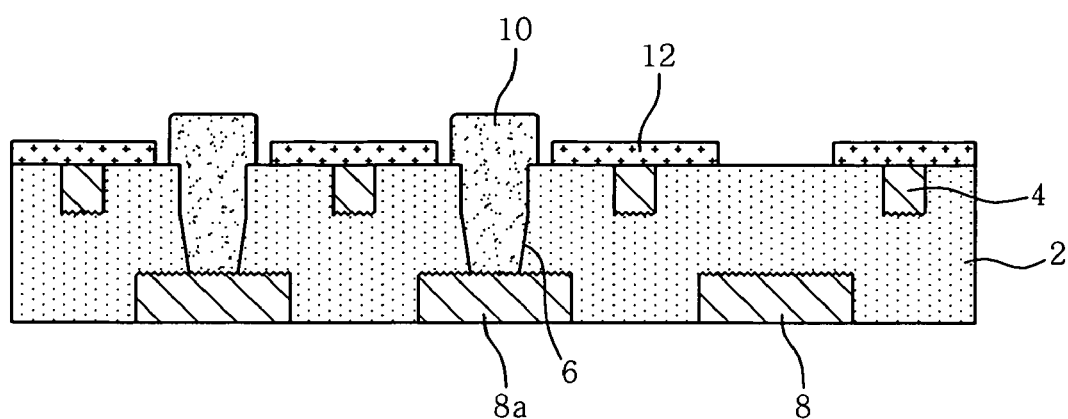
FIG. 7 is a cross-sectional view showing a printed circuit board according to another embodiment of the present invention.

FIG. 7 is a cross-sectional view showing a printed circuit board according to another embodiment of the present invention.

Referring to FIG. 7, the printed circuit board according to another embodiment of the present invention comprises: an insulation layer 2; a first circuit pattern 4 embedded in the upper surface of the insulation layer 2 such that it is flush with the upper surface; second circuit patterns 8 and 8a embedded in the lower surface of the insulation layer 2 such that they are flush with the lower surface; a via hole 6 formed in the insulation layer 2 deviating from the first circuit pattern 4 and allowing the upper surface of the second circuit pattern 8a to be exposed therethrough; a solder resist layer 12 formed on the insulating layer 2 but not the via hole 6; and a bump 10 integrally formed on the second circuit pattern 8a through the via hole 6 such that it protrudes from the insulation layer 2 to be higher than the solder resist layer 12.

In this embodiment, the components of the printed circuit board shown in FIG. 7 are identified with the same reference numerals as those of the embodiment shown in FIGS. 2 to 6.

Although the insulation layer 2 is essentially made of resin material, which has excellent electrical properties, it may be mixed with reinforcing material such as pulp, glass fiber and glass nonwoven fabric so as to overcome disadvantages in which the resin material has poor mechanical strength and undergoes a large change in dimensions upon temperature variation (high coefficient of thermal expansion), as much as ten times that of metal.

The first circuit pattern 4 is embedded in the upper surface of the insulation layer 2 other than the area of the via hole 6 such that the upper surface thereof is flush with the upper surface of the insulation layer 2, and the lower surface of the first circuit pattern 4, which is embedded in the insulation layer 2 and thus not exposed, is formed to be uneven.

Further, the second circuit patterns 8 and 8a are embedded in the lower surface of the insulation layer 2 such that the lower surfaces thereof are flush with the lower surface of the insulation layer, and the second circuit patterns include the circuit pattern 8a, on which the via hole 6 is formed, and the circuit pattern 8, on which the via hole 6 is not formed.

The upper surfaces of the second circuit patterns 8 and 8a, which are embedded in the insulation layer 2 and are thus not exposed, are formed to be uneven.

The via hole 6 is formed through the insulation layer 2, but not through the first circuit pattern 4, such that the second circuit pattern 8a is exposed at the upper surface through the via hole 6.

Although the via hole 6 is formed in the form of a blind via hole, in which the upper surface of the second circuit pattern 8a is exposed through the via hole 6, the via hole 6 may be formed in the form of a through-hole in which the via hole 6 is formed through all of the insulation layer 2 and the second circuit pattern 8a.

The solder resist layer 12 is formed on both surfaces of the insulation layer 2 such that it covers a portion of the first circuit pattern 4 and a portion of the second circuit pattern 8, with the remaining portions of the first and second circuit patterns being exposed, so as to protect the first and second circuit patterns 4 and 8.

The bump 10 is integrally formed inside the via hole 6 such that it protrudes from the insulation layer 2 to be higher than the solder resist layer 12.

In this regard, the bump 10 is sized such that the head part of the bump 10, protruding from the insulation layer 2, has, at its lower end contacting the via land 4a, a diameter larger than the diameter of the via hole 6.

Alternatively, the bump 10 may be formed to be lower than the solder resist layer 12.

The bump 10 may be formed by filling the via hole 6 with conductive paste, and may be subjected to an OSP (Organic Solderability Preservative) process, so as to prevent oxidation of the portion exposed from the via land 4a.

Where the bump 10 is not subjected to the OSP process, the bump 10 may be covered with a plating layer 20 comprised of metals such as nickel and gold, as shown in FIG. 4A, or may be covered with a solder layer 22, as shown in FIG. 4B.

In this regard, the solder layer 22 may be comprised of conductive material, such as conductive paste.

The top surface of the bump 10 may be formed in a planar shape, as shown in FIGS. 3A and 3B, or may be formed in an overhanging shape 26 like a mushroom, as shown in FIG. 5.

In the case where the bump 10 is formed in the overhanging shape, the lower end of the head part of the bump 10 does not come into contact with the upper surface of the insulation layer 2, and the overhang-shaped head part is sized to be larger than the diameter of the via hole 6 but smaller than the diameter of the second circuit pattern 8a having the via hole 6 formed thereon.

In another alternative, the top surface of the bump 10 may be formed to be concave, thus having a recess 28, as shown in FIG. 6. In this case, the diameter and depth of the recess 28 may be controlled through an etching process using etching liquid.

As a result of this, in the mounting of ICs, the contact area between the bump 10 and an IC bump is increased, thus increasing the strength of adhesion therebetween.

As described above, the printed circuit board according to this embodiment of the present invention has advantages in electric testing since the bump 10, on which an IC is mounted, protrudes high, and it is possible to increase the reliability of the resulting printed circuit board since the contact area between the bump 10 and an IC bump, and thus the cohesion intensity therebetween, are increased.

In addition, since the printed circuit board according to this embodiment of the present invention has a small height difference between the solder resist layer 12 and the insulation layer 2, it is advantageous in that the underfill void is decreased at the time of mounting of ICs.

What is claimed is:

1. A printed circuit board, comprising:
    an insulation layer which includes a first circuit pattern, including at least one via land, embedded in an upper surface of the insulation layer such that it is flush with the upper surface, and a second circuit pattern formed in a lower surface of the insulation layer such that it is formed at a position corresponding to the at least one via land and is flush with the lower surface;
    a solder resist layer formed on the insulation layer;
    a via hole formed in the insulation layer to electrically connect the via land to the second circuit pattern; and
    a bump integrally formed on the second circuit pattern through the via hole and the via land such that it protrudes from the insulation layer to be higher than the solder resist layer,
    the bump including a head part and a planar upper surface, and
    a lower end of the head part, which is brought into contact with the via land, being larger than a diameter of the via hole but smaller than a diameter of the via land.

2. A printed circuit board, comprising:
    an insulation layer which includes a first circuit pattern, including at least one via land, embedded in an upper surface of the insulation layer such that it is flush with the upper surface, and a second circuit pattern formed in a lower surface of the insulation layer such that it is formed at a position corresponding to the at least one via land and is flush with the lower surface;
    a solder resist layer formed on the insulation layer;
    a via hole formed in the insulation layer to electrically connect the via land to the second circuit pattern; and
    a bump integrally formed on the second circuit pattern through the via hole and the via land such that it protrudes from the insulation layer to be higher than the solder resist layer,
    the bump including a head part and a concave upper surface having a recess in a center thereof, and
    a lower end of the head part, which is brought into contact with the via land, being larger than a diameter of the via hole but smaller than a diameter of the via land.

3. A printed circuit board, comprising:
    an insulation layer which includes a first circuit pattern, including at least one via land, embedded in an upper surface of the insulation layer such that it is flush with the upper surface, and a second circuit pattern formed in a lower surface of the insulation layer such that it is formed at a position corresponding to the at least one via land and is flush with the lower surface;
    a solder resist layer formed on the insulation layer, the solder resist layer being formed on the insulation layer such that it covers the first circuit pattern but does not cover the via land;
    a via hole formed in the insulation layer to electrically connect the via land to the second circuit pattern; and
    a bump integrally formed on the second circuit pattern through the via hole and the via land such that it protrudes from the insulation layer to be higher than the solder resist layer.

4. A printed circuit board, comprising:
    an insulation layer which includes a first circuit pattern, including at least one via land, embedded in an upper surface of the insulation layer such that it is flush with the upper surface, and a second circuit pattern formed in a lower surface of the insulation layer such that it is formed at a position corresponding to the at least one via land and is flush with the lower surface;
    a solder resist layer formed on the insulation layer;
    a via hole formed in the insulation layer to electrically connect the via land to the second circuit pattern;
    a bump integrally formed on the second circuit pattern through the via hole and the via land such that it protrudes from the insulation layer to be higher than the solder resist layer; and
    a plating layer formed on the bump.

5. A printed circuit board, comprising:
    an insulation layer which includes a first circuit pattern, including at least one via land, embedded in an upper surface of the insulation layer such that it is flush with the upper surface, and a second circuit pattern formed in a lower surface of the insulation layer such that it is formed at a position corresponding to the at least one via land and is flush with the lower surface;
    a solder resist layer formed on the insulation layer;
    a via hole formed in the insulation layer to electrically connect the via land to the second circuit pattern;
    a bump integrally formed on the second circuit pattern through the via hole and the via land such that it protrudes from the insulation layer to be higher than the solder resist layer; and
    a solder layer formed on the bump.

6. A printed circuit board comprising:
    an insulation layer;
    a first circuit pattern embedded in an upper surface of the insulation layer such that it is flush with the upper surface;
    a second circuit pattern embedded in a lower surface of the insulation layer such that it is flush with the lower surface;
    a via hole formed in the insulation layer deviating from the first circuit pattern and allowing an upper surface of the second circuit pattern to be exposed therethrough;
    a solder resist layer formed on the insulating layer other than the via hole; and
    a bump integrally formed on the second circuit pattern through the via hole such that it protrudes from the insulation layer to be higher than the solder resist layer,
    the bump including a head part and a planar upper surface, and
    a lower end of the head part, which is brought into contact with the via land, being larger than a diameter of the via hole.

7. A printed circuit board comprising:
    an insulation layer;
    a first circuit pattern embedded in an upper surface of the insulation layer such that it is flush with the upper surface;
    a second circuit pattern embedded in a lower surface of the insulation layer such that it is flush with the lower surface;

a via hole formed in the insulation layer deviating from the first circuit pattern and allowing an upper surface of the second circuit pattern to be exposed therethrough;

a solder resist layer formed on the insulating layer other than the via hole; and a bump integrally formed on the second circuit pattern through the via hole such that it protrudes from the insulation layer to be higher than the solder resist layer, the bump including a head part and a concave upper surface having a recess in a center thereof, and a lower end of the head part, which is brought into contact with the via land, being larger than a diameter of the via hole.

8. A printed circuit board comprising:

an insulation layer;

a first circuit pattern embedded in an upper surface of the insulation layer such that it is flush with the upper surface;

a second circuit pattern embedded in a lower surface of the insulation layer such that it is flush with the lower surface;

a via hole formed in the insulation layer deviating from the first circuit pattern and allowing an upper surface of the second circuit pattern to be exposed therethrough;

a solder resist layer formed on the insulating layer other than the via hole; and a bump integrally formed on the second circuit pattern through the via hole such that it protrudes from the insulation layer to be higher than the solder resist layer, the bump including an overhang-type head part.

9. A printed circuit board comprising:

an insulation layer;

a first circuit pattern embedded in an upper surface of the insulation layer such that it is flush with the upper surface;

a second circuit pattern embedded in a lower surface of the insulation layer such that it is flush with the lower surface;

a via hole formed in the insulation layer deviating from the first circuit pattern and allowing an upper surface of the second circuit pattern to be exposed therethrough;

a solder resist layer formed on the insulating layer other than the via hole;

a bump integrally formed on the second circuit pattern through the via hole such that it protrudes from the insulation layer to be higher than the solder resist layer; and a plating layer formed on the bump.

10. A printed circuit board comprising:

an insulation layer;

a first circuit pattern embedded in an upper surface of the insulation layer such that it is flush with the upper surface;

a second circuit pattern embedded in a lower surface of the insulation layer such that it is flush with the lower surface;

a via hole formed in the insulation layer deviating from the first circuit pattern and allowing an upper surface of the second circuit pattern to be exposed therethrough;

a solder resist layer formed on the insulating layer other than the via hole;

a bump integrally formed on the second circuit pattern through the via hole such that it protrudes from the insulation layer to be higher than the solder resist layer; and a solder layer formed on the bump.

* * * * *